(12) United States Patent
Kundu

(10) Patent No.: US 6,938,225 B2
(45) Date of Patent: Aug. 30, 2005

(54) SCAN DESIGN FOR DOUBLE-EDGE-TRIGGERED FLIP-FLOPS

(75) Inventor: Sandip Kundu, Austin, TX (US)

(73) Assignee: Intel Corporation, Santa Clara, CA (US)

( * ) Notice: Subject to any disclaimer, the term of this patent is extended or adjusted under 35 U.S.C. 154(b) by 233 days.

(21) Appl. No.: 10/235,118

(22) Filed: Sep. 4, 2002

(65) Prior Publication Data

US 2004/0041610 A1 Mar. 4, 2004

(51) Int. Cl.[7] .............................................. G06F 17/50
(52) U.S. Cl. ................................................ 716/1; 716/4
(58) Field of Search .................. 716/1, 4; 714/726–727, 714/733; 327/202, 212

(56) References Cited

U.S. PATENT DOCUMENTS

| | | | |
|---|---|---|---|
| 4,833,676 A | * | 5/1989 | Koo ............................ 714/726 |
| 5,068,881 A | * | 11/1991 | Dervisoglu et al. ........... 377/70 |
| 5,130,989 A | * | 7/1992 | Anderson et al. ........... 714/726 |
| 5,392,441 A | * | 2/1995 | Brasher et al. ............. 710/305 |
| 5,598,120 A | * | 1/1997 | Yurash ........................ 327/202 |
| 6,185,710 B1 | * | 2/2001 | Barnhart ..................... 714/727 |
| 6,300,809 B1 | * | 10/2001 | Gregor et al. .............. 327/200 |

OTHER PUBLICATIONS

1 Low power design using double edge triggered flip–flops Hossain, R.; Wronski, L.D.; Albicki, A. Very Large Scale Integration (VLSI) Systems, IEEE Transactions on , vol.: 2, Issue: 2 , Jun. 1994, pp.: 261–265.
2 Double edge triggered devices: Speed and power constraints Hossain, R.; Wronski, L.; Albicki, A. Circuits and Systems, 1993., ISCAS '93, 1993 IEEE International Symposium on May 1993, pp.: 1491–1494, vol. 3.

* cited by examiner

*Primary Examiner*—Vuthe Siek
*Assistant Examiner*—Paul Dinh
(74) *Attorney, Agent, or Firm*—Cindy T. Faatz

(57) ABSTRACT

A double-edge-triggered flip-flop scan cell. The double-edge-triggered flip-flop scan cell provides the capability to capture and output data for each edge of a clock signal in a functional mode of a host integrated circuit. In a test mode, the double-edge triggered flip-flop scan cell enables test data to be scanned into and out of the scan cell to provide observability and controllability of the scan cell internal state.

11 Claims, 4 Drawing Sheets

SCAN DESIGN FOR DOUBLE-EDGE-TRIGGERED FLIP-FLOPS

BACKGROUND

1. Field

An embodiment of the present invention relates to the field of integrated circuit design for test and more particularly, to scan design for double-edge-triggered flip-flops.

2. Discussion of Related Art

Scan chains including scan elements are frequently included in integrated circuits to provide the capability to control and observe internal states of the integrated circuit during testing or debug, for example.

For an integrated circuit device that implements scan capabilities there are typically two modes: a test mode and a functional mode. In the test mode, the internal state is configured into a scan chain that provides for control and/or observation of internal states. In the functional mode, the integrated circuit device operates according to specification (assuming a properly functioning part).

For a typical scan operation, an integrated circuit device is switched into a test or scan mode and the desired test data is scanned into the scan chain. The integrated circuit device is then switched into a functional mode and one or more functional clocks are applied. The device is then switched back into the scan mode to scan out captured values in order to observe the internal states of the device.

To provide for high controllability and observability, it is desirable to have a scan cell associated with each state element in an integrated circuit.

BRIEF DESCRIPTION OF THE DRAWINGS

The present invention is illustrated by way of example and not limitation in the figures of the accompanying drawings in which like references indicate similar elements, and in which.

DETAILED DESCRIPTION

A method and apparatus for scan design for a double-edge-triggered flip-flop is described. In the following description, particular types of integrated circuits, circuit configurations, logic blocks and signals are described for purposes of illustration. It will be appreciated, however, that other embodiments are applicable to other types of integrated circuits, circuit configurations, logic blocks and signals.

Double-edge-triggered flip-flops (DETFFs), also referred to as dual-edge-triggered flip-flops, sample an input signal at both rising and falling edges of an input clock signal while single-edge-triggered flip-flops only sample an input signal at one edge of an input clock signal (i.e. either rising or falling). Double-edge-triggered flip-flops may be used, for example, with double-data-rate, source synchronous busses and/or for other applications where it is desirable to save power.

A double-edge-triggered flip-flop may enable power savings by allowing a clock frequency to be halved because the DETFF is capable of capturing data at twice the rate of a single-edge-triggered flip-flop clocked at the same frequency. In other words, for a DETFF, the clock and data toggle rates are the same, while for a single-edge-triggered flip-flop, the clock toggle rate is 2× the data toggle rate. Given that clock power may be somewhere in the range of 25–40% of overall toggle power for an exemplary integrated circuit, the power savings that may be realized by using a DETFF, may be significant.

Schematic diagrams and accompanying descriptions of some exemplary double-edge-triggered flip-flops may be found, for example, in a publication entitled, "Low Power Design Using Double-edge Triggered Flip-Flops," by R. Hossain, L. D. Wronski, and A. Albicki, *IEEE Transactions on Very Large Scale Integration (VLSI) Systems*, Vol. 2, No. 2, pp. 261–265. It will be appreciated that double-edge-triggered flip-flops implemented in a different manner may be used in accordance with various embodiments.

Figure 1:
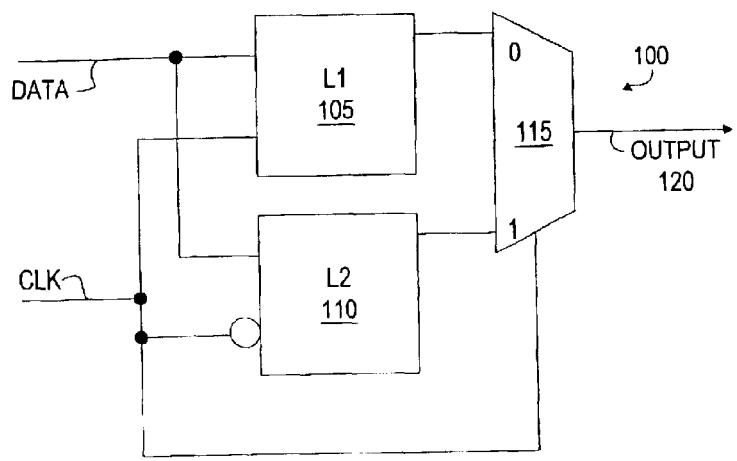
FIG. 1 is a logic diagram of a double-edge-triggered flip-flop.

Referring to FIG. 1, a logic diagram of an exemplary double-edge-triggered flip-flop 100 is shown. The DETFF of FIG. 1 includes two latches, L1 105 and L0 110, and a multiplexer (mux) 115 that provides an output signal at an output 120.

In operation, when an input clock signal CLK is high, data indicated by an input data signal is captured at the latch L1 105. The output node 120, however, is not immediately updated. This is because the CLK signal also provides a select signal for the mux 115. When the CLK signal is high, the output of the latch L1 110 is selectively provided at the output 120 of the mux 115. In this manner, data race-through is prevented. When the CLK signal then transitions low, latch L1 105 is disabled and latch L0 110 captures input data indicated by the data signal, while the output of L1 105 is selected to be provided at the mux 115 output 120. In this manner, data is captured at every clock transition, but not allowed to race ahead.

A double-edge-triggered flip-flop such as the flip-flop 100 provides a state element for which it is desirable to have scan capability for integrated circuits that implement either full or partial scan. In particular, it is desirable to be able to scan data into, and out of, a DETFF in a controllable and observable manner for visibility into internal states related to the DETFF when a host integrated circuit chip is in a test mode.

Figure 2:
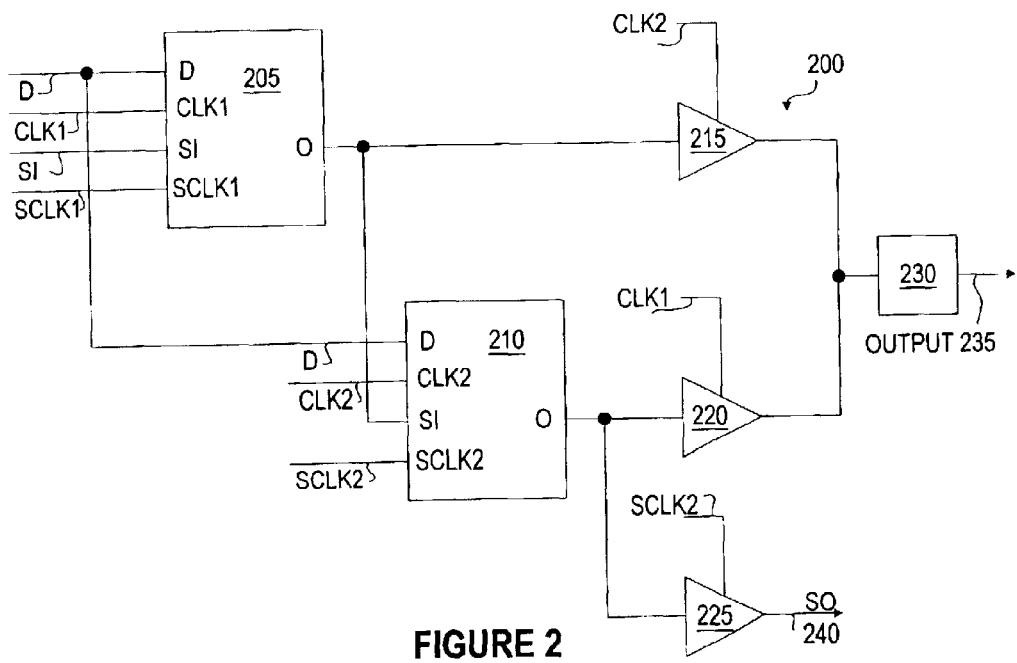
FIG. 2 is a logic diagram of a double-edge-triggered flip-flop scan cell of a first embodiment that includes tri-state drivers and implements hold scan capabilities.

For one embodiment, such controllability and observability may be provided using the exemplary DETFF scan cell 200 shown in FIG. 2. The DETFF scan cell 200 may be used, for example, to provide a DETFF scan cell 300 implemented on a host integrated circuit 305 as shown in FIG. 3.

Figure 3:
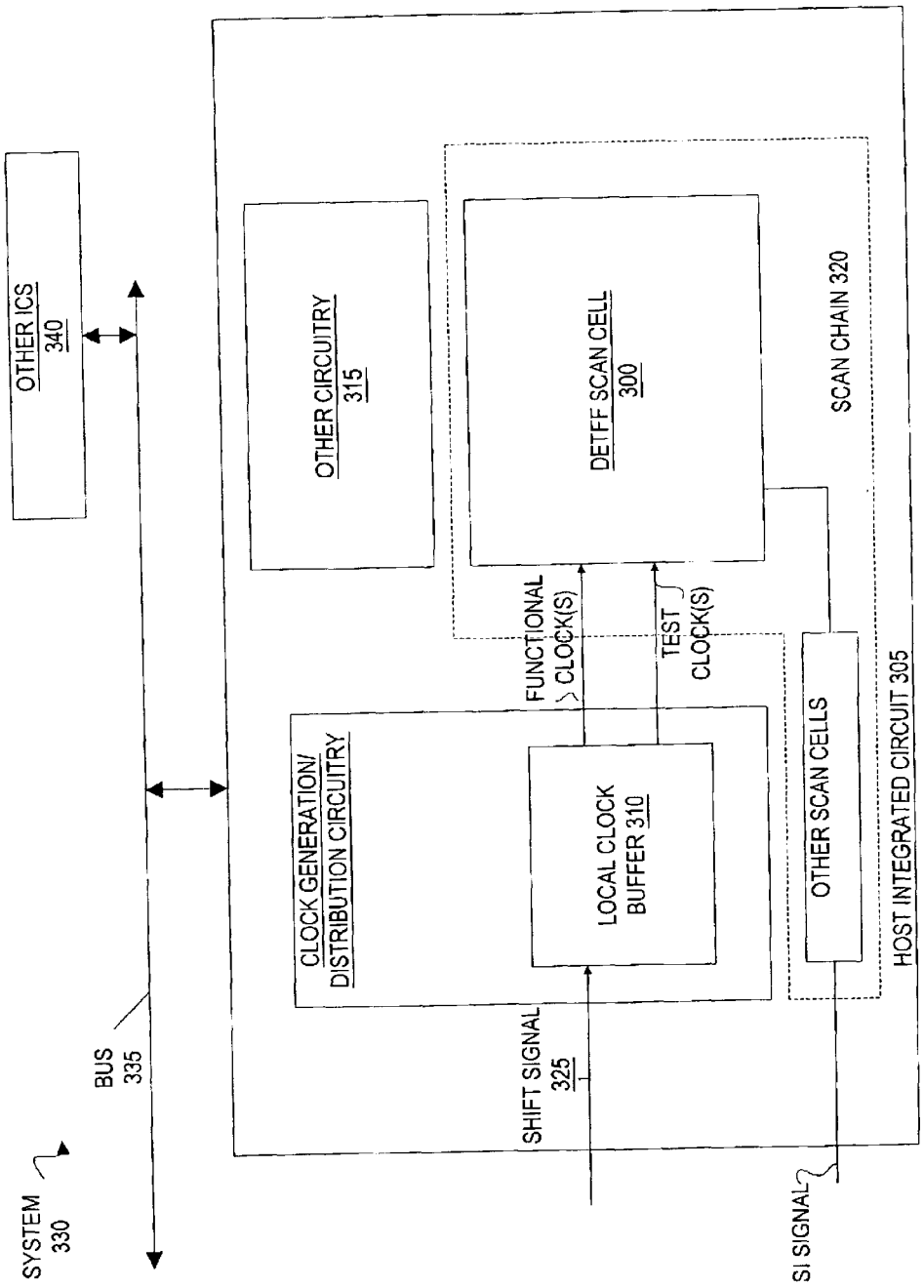
FIG. 3 is a block diagram of a system including a host integrated circuit that includes a double-edge-triggered flip-flop of one embodiment.

As shown in FIG. 3, the host IC 305 may be implemented in a system 330 and coupled to a bus 335 and to other ICs 340 in the system 330 via the bus 335. The host IC 305 may be a microprocessor, for example. Alternatively, the host IC 305 may be any other type of integrated circuit for which it is desirable to use a DETFF and for which scan capabilities for the DETFF are desired. The other ICs 340 may include one or more input devices through which a user may control the mode of the host IC 305, provide test data or otherwise control the host IC 305 during a debug or testing operation. The other ICs 340 may also include one or more output devices that may be capable of enabling a user to observe results of testing or debugging operations including data that is scanned out of the scan cell 300 and/or other cells in the scan chain.

The DETFF scan cell 200 of FIG. 2 includes dual-ported latches 205 and 210, tri-state drivers 215, 220 and 225 and sustain circuitry 230. Dual-ported latches 205 and 210 each include two data inputs and two clock inputs. Each of the dual-ported latches 205 and 210 receives a data (D) signal at a first data (D) input. The latch 205 also receives a first functional clock signal CLK1 at a first clock input, a scan in (SI) signal at a second data input and a first test clock signal SCLK1 at a second clock input. The SI signal may transmit test data to the scan cell 200 that is provided, for example, by test patterns generated by an automatic test pattern generator or from another source.

The latch 210 also has a first clock input coupled to receive a second functional clock signal CLK2, a second clock input coupled to receive a second test clock signal SCLK2 and a second data input (SI) coupled to an output of the first latch 205. The output of the latch 205 is also coupled to an input of the tri-state driver 215, while an output of the latch 210 is coupled to inputs of each of the tri-state drivers 220 and 225.

The tri-state drivers 215 and 220 are controlled by functional mode clocks CLK1 and CLK2, respectively, as shown, to provide an output signal at an output 235 for the circuit 200 during a functional mode of a host integrated circuit. The tri-state driver 225 is controlled by the second test clock SCLK2 to provide a scan output (SO) signal at an SO node 240 during a test mode of the host integrated circuit. The tri-state driver 225 may not be included for some embodiments. Where the tri-state driver 225 is used, however, it helps to reduce power consumption by preventing the SO output node 240 from toggling during a functional mode.

The functional mode clock signals CLK1 and CLK2 and test mode clock signals SCLK1 and SCLK2 of one embodiment may be generated, distributed and enabled in any manner using known clock generation, distribution and enabling circuitry and techniques. Referring to FIG. 3, for example, for one embodiment, each of the functional mode and test mode clock signals CLK1, CLK2, SCLK1 and SCLK2 to be used by the DETFF scan cell 300 is generated at a clock buffer 310 local to the DETFF scan cell 300.

The functional mode clock signals CLK1 and CLK2 are enabled during a functional mode of the host integrated circuit 305 and disabled (e.g. held low in this exemplary embodiment) during a test mode. Conversely, the test mode clock signals SCLK1 and SCLK2 are enabled during a test mode of the integrated circuit 305 and disabled (e.g. held low for one embodiment) during a functional mode. For the purposes of illustration, it has been assumed that the clocks are active during a high state. However, for other embodiments, one or more active low clocks and corresponding circuitry may alternatively be used.

For one embodiment, the various clock signals are enabled/disabled in response to a SHIFT signal that indicates whether the integrated circuit 305 is in a test mode or a functional mode. The SHIFT signal may be received by the clock generation circuitry 310 at a SHIFT signal input 325 via a multiplexed pin on the host integrated circuit 305, for example. Other approaches for indicating whether the integrated circuit that includes the DETFF scan cell 300 is in a functional mode or a test mode are within the scope of various embodiments.

Also, for one embodiment, CLK1 and CLK2 signals are complementary to each other while SCLK1 and SCLK2 signals are complementary to each other. Further, for one embodiment, each of the test and functional mode clock signals has a duty cycle substantially equal to 50%. In a functional mode, CLK1 and CLK2 signals are complementary, while SCLK1 and SCLK2 are in their OFF state. Conversely, in a scan mode, SCLK1 and SCLK2 are complementary, while CLK1 and CLK2 remain in OFF state.

Referring back to FIG. 2, the dual-ported latches 205 and 210 may be configured in any manner to provide the functionality described below. An example of a dual-ported latch that may be used to provide one or more of the dual-ported latches 205 and/or 210 is shown and described in S. Funatsu, N. Wakatsuki, and T. Arima, "Test generation systems in Japan", in Proc. Of 12th Design Automation Symp., June 1975, pp. 114–122. and S. Funatsu, N. Wakatsuki, and A. Yamada, "Designing digital circuits with easily testable consideration", in Proc. Int. Test Conf. (ITC), September 1978, pp. 98–102.

The tri-state drivers 215, 220 and 225 and the sustain circuitry 230 may be implemented in accordance with well-known designs for such structures to provide the functionality described herein.

With continuing reference to FIG. 2, in operation, in a functional mode, input data is received at a data (D) input of the dual-ported latch 205 and captured by the latch 205 as the CLK1 signal transitions high. Also, in response to the CLK1 signal transitioning high, the tri-state buffer 220 is enabled to provide data previously captured by the latch 210 at an output 235 of the circuit 200.

Then, as the CLK2 signal transitions high (and therefore, the CLK1 signal transitions low), data indicated by the data (D) signal is captured at the latch 210 and the tri-state driver 215 is enabled. Enabling the tri-state driver 215 causes data previously stored in the latch 205 to be provided at the output 235 of the circuit 200.

Because the test clock SCLK2 is disabled, the SO output of the tri-state driver 225 does not toggle during a functional mode, thereby saving power as compared to an implementation that does not use a tri-state driver.

Thus, as described above, during a functional mode, data is captured by the DETFF scan cell 200 at each cycle of each of the CLK1 and CLK2 signals to provide dual edge-triggered flip-flop functionality. In other words, because the CLK1 and CLK2 signals are complementary and data is captured at one of the latches for each rising edge of either the CLK1 or CLK2 signals, data is effectively captured twice for each clock cycle.

In response to the host integrated circuit 305 (FIG. 3) entering a test mode, functional clock signals CLK1 and CLK2 are disabled and test clock signals SCLK1 and SCLK2 are enabled. During the test mode, the sustain circuitry 230 operates in a well-known manner to sustain a previous functional mode output value of the DETFF scan cell 200 such that the circuit 200 provides "Hold Scan" capabilities (i.e. the scan cell 200 holds the functional mode value while the internal state is being scanned). Further, because the functional mode clock signals CLK1 and CLK2 are disabled (i.e. held low) during a test mode, the outputs of the tri-state buffers 215 and 220 do not toggle, thereby reducing power dissipation as compared to one or more similar implementations that do not prevent the functional mode output from toggling.

In the test mode, as the SCLK1 signal transitions high, the SCLK2 signal transitions low and data at the SI input of the latch 205 is captured at the latch 205. As the SCLK2 signal then transitions high, data captured at the latch 205 is sampled at the SI input of the latch 210 and provided to the tri-state driver 225. The high-going transition of the SCLK2 signal also causes the tri-state driver 225 to be enabled to provide a scan out (SO) output signal. In the above-described manner, during a test mode, the latches 205 and 210 are effectively in a master-slave configuration and provide a scan out (SO) signal for each cycle of the SCLK2 signal.

While the data capture rate for the test mode of the DETFF scan cell 200 is slower than the data capture rate for the functional mode, the DETFF scan cell 200 provides the capability to observe and control the internal state of a DETFF circuit as described above. Further, the slower data capture rate is typically acceptable and, in many cases, desirable, for scan applications. This is because the number of nodes toggling during a test mode may, in some cases, be higher than the number of nodes toggling during a functional mode such that it is desirable to reduce power dissipation during the test mode.

Referring to FIGS. 2 and 3, in a typical scan application in which the scan cell 200 may be used to provide the scan cell 300, data may be scanned via an SI data signal into a scan chain 320 including the scan cell 300 during a test mode of the integrated circuit (IC) 305. The data may be scanned in, for example, via a particular pin on the host IC 305 that may or may not be multiplexed so as to provide a different function during a functional mode of the IC 305.

The host integrated circuit 305 may then be transitioned into a functional mode in response to a transition of the SHIFT signal received at a SHIFT signal input 325 such that one or more functional mode clock signal(s) may be applied to the circuit 300 and other circuits in the scan chain 320 for a given period of time. The integrated circuit 305 may then be transitioned back into a test mode in response to a transition of the SHIFT signal, such that data from the scan cell 300 and other circuits in the scan chain 320 may be scanned out to observe the internal state of the corresponding state elements. Other approaches for using the scan cell 300 are within the scope of various embodiments.

Figure 4:
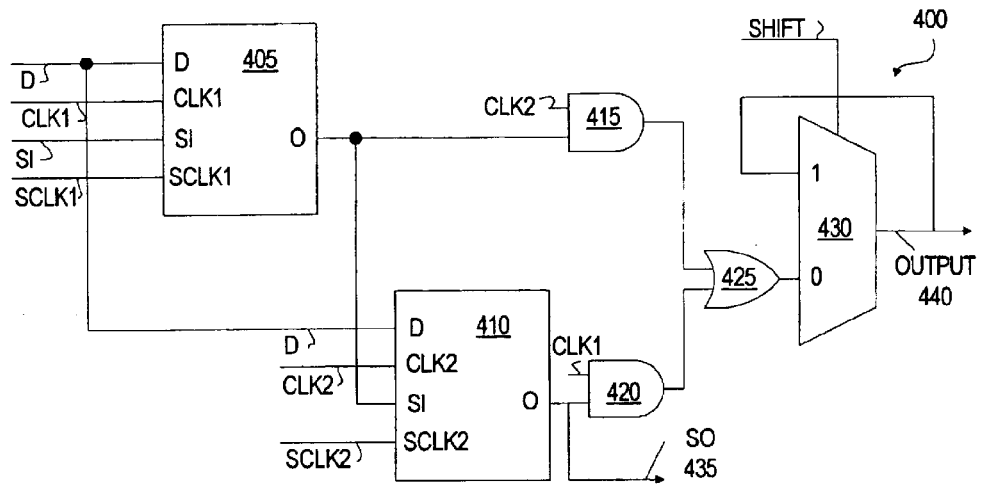
FIG. 4 is a logic diagram of a double-edge-triggered flip-flop scan cell of a second embodiment that implements hold scan and replaces tri-state drivers with a multiplexer and associated logic.

FIG. 4 is a logic diagram of a DETFF scan cell 400 of another embodiment that may alternatively be used to provide the DETFF scan cell 300 of FIG. 3. The DETFF scan cell 400, like the DETFF scan cell 200 of FIG. 2, includes two dual-ported latches 405 and 410 that may be similar in configuration and operation to the dual-ported latches 205 and 210 of FIG. 2. Further, the latches 405 and 410 are coupled to each other and to corresponding test mode and functional mode data and clock input signals in a similar manner to corresponding elements of FIG. 2. The test and functional mode clock signals SCLK1 and SCLK2, and CLK1 and CLK2, respectively, and test and functional mode data signals D and SI, respectively, may be generated and controlled in a similar manner and have similar characteristics to the corresponding clock and data signals described in reference to FIG. 2.

In contrast to the scan cell 200 of FIG. 2, however, the scan cell 400 includes AND gates 415 and 420, an OR gate 425 and an output multiplexer (mux) 430 in place of the above-described tri-state drivers and sustain circuitry of the scan cell 200.

The AND gate 415 has one input coupled to an output of the dual-ported latch 405, a second input coupled to receive the CLK2 signal and an output coupled to one input of the OR gate 425. The AND gate 420 has one input coupled to an output of the dual-ported latch 410, which also provides the SO output signal at an SO output 435, another input coupled to receive the CLK1 signal and an output coupled to a second input of the OR gate 425. The OR gate 425 has an output coupled to one input of the mux 430. Another input of the MUX 430 is coupled to an output of the MUX 430 in a feedback configuration as shown. A select input of the MUX is coupled to receive a SHIFT signal (which may be similar in function and operation to the previously described SHIFT signal).

In operation, during a functional mode, CLK1 and CLK2 signals are enabled and SCLK1 and SCLK2 signals are disabled as described above. As the CLK1 signal transitions high (and, therefore, the CLK2 signal transitions low), data indicated by the data (D) signal is captured at the latch 405. Also as CLK1 transitions high, a data value stored by the latch 410 is provided at an output of the AND gate 420 to the OR gate 425.

In a functional mode, for one embodiment, the SHIFT signal is low such that an output of the OR gate 425 is provided at an output 440 of the circuit 400. Because the CLK2 signal is low when the CLK1 signal is high, the output of the OR gate 425 indicates the value stored by the latch 410 when CLK1 transitions high.

As the CLK2 signal transitions high, and the CLK1 signal transitions low, data indicated by the data (D) signal is captured at the latch 410. Also, the CLK2 input of the AND gate 415 transitions high and the CLK1 input of the AND gate 420 transitions low such that a value stored by the latch 405 is provided at the output 440 of the scan cell 400.

For a test mode, the SHIFT signal transitions high, CLK1 and CLK2 signals are disabled and SCLK1 and SCLK2 signals are enabled. When the SHIFT signal is high, the previous output value at the output node 440 is maintained via the feedback path through the mux 430 as shown in FIG. 4 such that hold scan capability is provided as described above.

In the test mode, as SCLK1 transitions high, data indicated by the SI signal is captured by the latch 405. Then, as SCLK2 transitions high, data at the output of the latch 405 is captured at the latch 410 and provided at the scan out (SO) output node 440. In this manner, the scan cell 400 is in a master-slave flip-flop configuration similar to the scan cell 200 of FIG. 2 during a test mode and similarly provides output data for each SCLK2 cycle.

The scan cell 400 of FIG. 4 may be larger in area than the scan cell 200 of FIG. 2, but may be preferable over the scan cell 200 where it is desirable to avoid any potential noise issues that may be caused the tri-state drivers of the scan cell 200.

Figure 5:
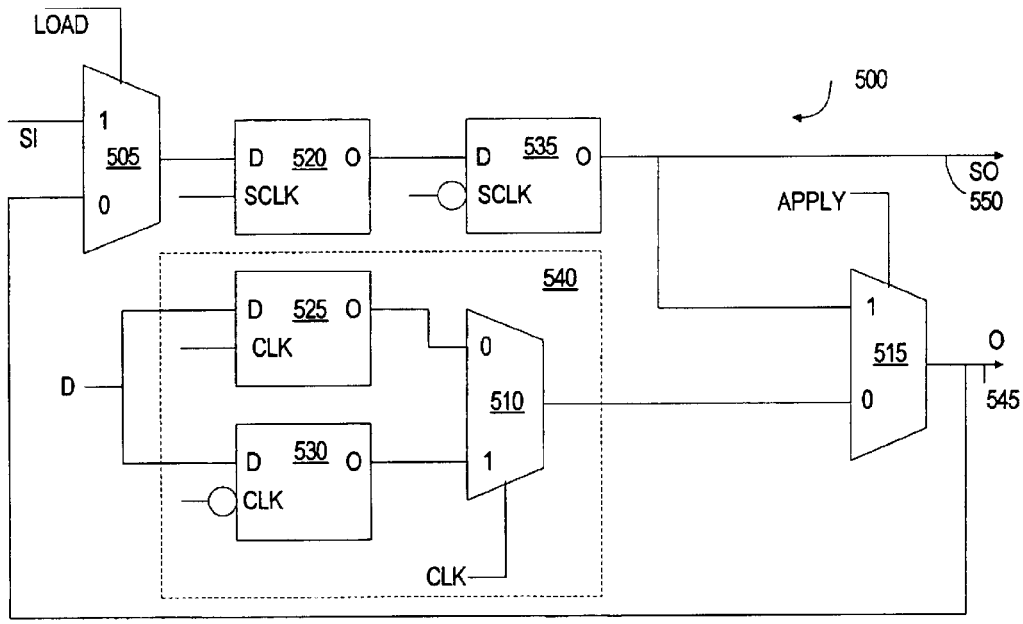
FIG. 5 is a logic diagram of a double-edge-triggered flip-flop scan cell of a third embodiment that separates the scan path and the functional path.

FIG. 5 shows a schematic diagram of a DETFF scan cell 500 of another embodiment that may be advantageously used to provide the DETFF scan cell 300 of FIG. 3, for example. It will be appreciated by those of ordinary skill in the art that the scan cell 500, as well as other scan cells described herein, may alternatively be used for a variety of different applications other than to provide the scan cell 300.

The scan cell 500, unlike the above-described scan cells, uses a single functional clock signal CLK and a single test clock signal SCLK. The clock signals CLK and SCLK may be generated, distributed and selectively enabled in a similar manner to the functional and test mode clock signals described above.

The scan cell 500 includes muxes 505, 510 and 515 and single-ported latches 520, 525, 530 and 535. Each of the muxes 505, 510 and 515 and the latches 520, 525, 530 and 535 may be implemented using any of a variety of well-known multiplexer and latch circuits that provide the below-described functionality.

For the scan cell 500, a sub-circuit 540 including the latches 525 and 530 and the multiplexer 510 is configured and operates in a similar manner to the DETFF circuit 100 of FIG. 1 during a functional mode. For one embodiment, an output of the circuit 540 is provided to the 0 input of the multiplexer 515, which is selectively provided to an output node 545 when an APPLY signal is low. Also during the functional mode, the SCLK signal is disabled such that data is not captured at the latch 520.

In a test mode, which, like the embodiments described above, may be entered into in response to asserting a SHIFT signal, a LOAD signal may be asserted to load the scan path including the scan cell 500 with data. In the test mode, when the LOAD signal is asserted, i.e. when the LOAD signal is low for the embodiment shown in FIG. 5, data at the functional output 545 is loaded into the scan path at the latch 520 in response to a rising edge transition of the SCLK signal for the embodiment shown in FIG. 5. In this scheme, the scan shift can proceed concurrently with the functional operation. The LOAD signal may be applied after scan and functional clocks have been halted to observe functional contents, while the APPLY signal may be applied after the scan and functional clocks have been halted to alter content of the state elements. This feature is particularly useful in system debug environment.

Then, as the SCLK signal transitions low, data previously captured at the latch 520, which is in a master-slave configuration with the latch 535, is captured at the latch 535 and provided at an SO output 550. Data at the output of the latch 535 is also provided to an input of the mux 515 and selectively provided at the output node 545 in response to an APPLY signal being asserted.

In the test mode, if the LOAD signal is not asserted, data is loaded into the scan path, including the scan cell 500, via the scan in (SI) signal. The LOAD and APPLY signals may be generated and controlled in any manner. For one embodiment, the LOAD and/or APPLY signals, like the SHIFT signal, are responsive to user input to provide the desired functionality. Use of the LOAD and APPLY control signals in the above-described manner, provides observability and controllability for the scan cell 500.

The scan cell 500, as described above, provides a scan path that is completely separate from the functional path and that shadows the internal state of the DETFF. The scan cell 500 provides the capability to load the scan path from the internal state and further provides the capability to mask out the internal state of the DETFF through the use of the APPLY signal.

Figure 6:
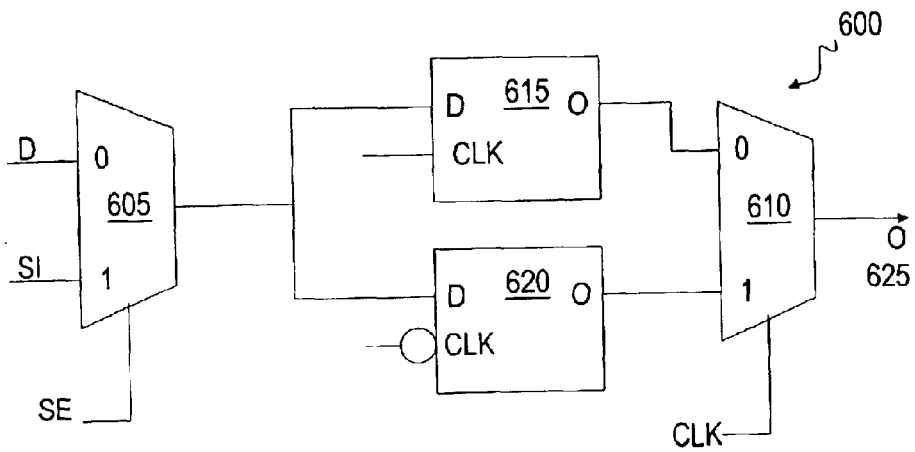
FIG. 6 is a logic diagram of a double-edge-triggered flip-flop scan cell of a fourth embodiment that includes a multiplexer at an input.

FIG. 6 is a logic diagram of a DETFF scan cell 600 of another embodiment that may also be advantageously used to provide the scan cell 300 of FIG. 3 or another scan cell. While the previously-described embodiments are clock scan implementations, i.e. different clock signals are used to control the scan cell circuitry depending on whether the circuit is to operate in a test mode or a functional mode, the scan cell 600 is a muliplexer or mux scan implementation.

The scan cell 600 includes muxes 605 and 610 and latch elements 615 and 620. The mux 605 receives a scan enable (SE) select signal which, for one embodiment, may be provided by the previously-described SHIFT signal in a similar manner or by another control signal related to a test mode of a host integrated circuit that includes the scan cell 600. For the embodiment shown in FIG. 6, the SE signal is active high such that when the SE signal is asserted, the scan in (SI) data input signal is selectively transmitted to the latches 615 and 620 and when the SE signal is not asserted, the functional data (D) input signal is selectively transmitted to the latches 615 and 620.

Thus, in a test mode, for example, when the SE signal is asserted, the SI data input signal is provided to the latches 615 and 620. The latch 615 receives a clock signal CLK, while the latch 620 receives a complement of the CLK signal. As the CLK signal transitions high, data indicated by the SI signal is captured at the latch 615 and data at an output of the latch 620 is provided to an output node 625 of the scan cell 600. Then, as the CLK signal transitions low, data indicated by the SI signal is captured at the latch 620 and data previously captured by the latch 615 is provided at the output node 625.

For a functional mode, where the SE signal is low for the embodiment shown, the functional data input stream (D) is instead provided to the latches 615 and 620. Otherwise the operation of the scan cell 600 is the same as that described for the test mode.

In the manner described above, the scan cell 600 provides a mux scan approach that may be used where the performance penalty incurred by the multiplexer 605 is not problematic. For the scan cell 600, even in the test mode, data is provided at each edge of the clock signal CLK such that the power dissipation may be higher in a test mode than for some of the other embodiments described above, but the data capture rate during a scan mode is also higher.

Thus, various embodiments of a double-edge triggered scan cell and implementations using a double-edge triggered scan cell have been described. The double-edge triggered scan cells of various embodiments provide observability and controllability for double-edge triggered flip-flop elements where scan capabilities are desired.

Figure 7:
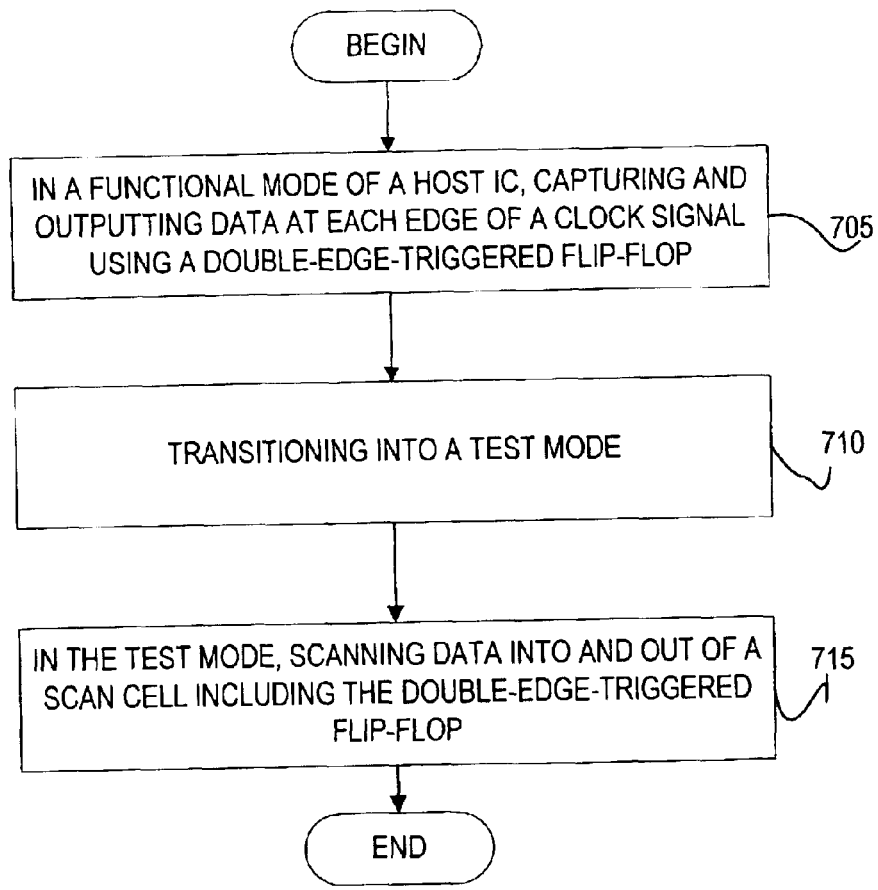
FIG. 7 is a flow diagram showing a method of one embodiment for providing scan capabilities for a double-edge-triggered flip-flop.

FIG. 7 is a flow diagram showing a method of one embodiment for providing scan capabilities for a DETFF. At processing block 705, in a functional mode of an integrated circuit data is captured by and provided at an output of a double-edge-triggered flip-flop for each transition of a clock signal. At block 710, the integrated circuit is transitioned to a test mode, and at block 715, in the test mode, data is scanned into and out of a scan cell including the double-edge triggered flip-flop.

In the foregoing specification, the invention has been described with reference to specific exemplary embodiments thereof. It will, however, be appreciated that various modifications and changes may be made thereto without departing from the broader spirit and scope of the invention as set forth in the appended claims. For example, complementary signals and/or logic may be used for various embodiments, well-known circuit elements and/or signals may be implemented or provided in a variety of different ways, and/or a variety of different host integrated circuits may implement such designs. The specification and drawings are, accordingly, to be regarded in an illustrative rather than a restrictive sense.

What is claimed is:

1. An apparatus comprising:

a double-edge-triggered flip-flop (DETFF) scan cell including at least first and second latches coupled to function as a double-edge triggered flip-flop in a functional mode, the at least first and second latches including first and second dual-ported latches, each of the dual-ported latches to receive a test mode clock signal at a time when an integrated circuit that includes the DETFF scan cell is in a test mode, and a functional mode clock signal at a time when the integrated circuit that includes the DETFF scan cell is in a functional mode;

a hold scan circuit coupled to an output of the DETFF scan cell to provide hold scan capability to hold a functional mode data value during a test mode; and first and second tri-state drivers, the first tri-state driver being coupled to an output of the first dual-ported latch, the second tri-state driver being coupled to an output of the second dual-ported latch, at least one of the first and second tri-state drivers to be coupled to the hold scan circuit, the hold scan circuit comprising a sustain circuit.

2. An apparatus comprising:

a double-edge-triggered flip-flop (DETFF) scan cell including at least first and second latches coupled to function as a double-edge triggered flip-flop in a functional made, the at least first and second latches including first and second dual-ported latches, each of the dual-ported latches to receive a test mode clock signal at a time when an integrated circuit that includes the DETFF scan cell is in a test mode, and a functional mode clock signal at a time when the integrated circuit that includes the DETFF scan cell is in a functional mode; and a hold scan circuit coupled to an output of the DETFF scan cell to provide hold scan capability to hold a functional mode data value during a test mode, wherein the hold scan circuit includes a multiplexer coupled to an output of each of the first and second dual-ported latches, and output of the multiplexer to be coupled to an input of the multiplexer.

3. An apparatus comprising:

at least first and second latches coupled to operate as a double edge triggered flip-flop in a functional mode;

at least first and second tri-state drivers, the first tri-state driver being coupled to an output of the first latch, the second tri-state driver being coupled to an output of the second latch, the first and second tri-state drivers to provide a functional mode data output of the respective latch during a functional mode; and a sustain circuit coupled to the first and second tri-state drivers to hold a functional mode data value during a test mode.

4. The apparatus of claim 3 further comprising:

a third tri-state driver coupled to one of the first and second latches, the third tri-state driver to provide an output of the respective latch during a test mode.

5. The apparatus of claim 3 wherein the first and second latches are dual-ported latches, each of the first and second latches being coupled to receive a functional mode clock signal and a test mode clock signal.

6. The apparatus of claim 5 further comprising;

a third tri-state driver coupled to one of the first and second latches, the third tri-state driver to provide an output of the respective latch during the test mode, the third tri-state driver being coupled to receive the test mode clock signal, the first and second tri-state drivers being coupled to receive the functional mode clock signal.

7. The apparatus of claim 5 wherein the first and second latches are coupled in a master-slave configuration during the test mode.

8. An apparatus comprising:

at least first and second latches coupled to operate as a double edge triggered flip-flop in a functional mode;

a multiplexer coupled to outputs of the first and second latches, the multiplexer having an output coupled to a first input to hold a functional mode data value during a test mode; and combinatorial logic coupled between the outputs of the at least first and second latches and a second input of the multiplexer.

9. The apparatus of claim 8 wherein the at least first and second latches are dual ported latches.

10. The apparatus of claim 9 wherein each of the at least first and second latches is coupled to receive a functional mode clock signal, a test mode clock signal, a functional mode data signal and a test mode data signal.

11. The apparatus of claim 10 wherein the at least first and second latches are coupled in a master-slave configuration during the test mode, the test mode data signal input for one of the first and second latches being coupled to an output of the other latch.

* * * * *